United States Patent
Abe et al.

(10) Patent No.: US 9,313,912 B2
(45) Date of Patent: Apr. 12, 2016

(54) ELECTRONIC DEVICE STORAGE CASE

(75) Inventors: Yutaka Abe, Watarai-gun (JP); Keizo Nishikawa, Watarai-gun (JP); Hirotaka Hamaguchi, Tsu (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 576 days.

(21) Appl. No.: 13/166,025

(22) Filed: Jun. 22, 2011

(65) Prior Publication Data
US 2011/0315580 A1 Dec. 29, 2011

(30) Foreign Application Priority Data
Jun. 28, 2010 (JP) ................................ 2010-146256

(51) Int. Cl.
*H05K 5/00* (2006.01)
*H05K 7/14* (2006.01)

(52) U.S. Cl.
CPC .............. *H05K 7/1417* (2013.01); *H05K 5/006* (2013.01)

(58) Field of Classification Search
CPC ............................ H05K 5/006; H05K 7/1417
USPC .......................................... 206/320; 361/752
See application file for complete search history.

(56) References Cited

U.S. PATENT DOCUMENTS

| | | | | |
|---|---|---|---|---|
| 5,045,971 A * | 9/1991 | Ono et al. | | 361/704 |
| 5,515,240 A * | 5/1996 | Rodeffer et al. | | 361/759 |
| 5,905,550 A * | 5/1999 | Ohgami et al. | | 349/58 |
| 5,944,210 A * | 8/1999 | Yetter | | 220/4.21 |
| 6,025,991 A * | 2/2000 | Saito | | 361/704 |
| 6,027,535 A * | 2/2000 | Eberle et al. | | 361/690 |
| 6,111,760 A * | 8/2000 | Nixon | | 361/814 |
| 7,065,209 B2 * | 6/2006 | Stanton et al. | | 379/433.01 |
| 7,944,690 B2 * | 5/2011 | Yamagiwa | | 361/679.58 |
| 8,148,633 B2 * | 4/2012 | Hung | | 174/50 |
| 2001/0009503 A1 | 7/2001 | Watanabe | | |

(Continued)

FOREIGN PATENT DOCUMENTS

| | | |
|---|---|---|
| CN | 1955083 | 5/2007 |
| JP | H09-66989 | 3/1997 |
| JP | 2001-210971 A | 8/2001 |

(Continued)

OTHER PUBLICATIONS

Office Action dated Jul. 15, 2013 issued in the corresponding Chinese application No. 201110180004.9 (w/English translation thereof).
Japanese Office Action dated Jan. 28, 2014 issued in corresponding Japanese Application No. 2010-146256.
Office Action dated Jul. 1, 2014 issued in corresponding Japanese application No. 2010-146256.

*Primary Examiner* — David M Sinclair
*Assistant Examiner* — Theron Milliser
(74) *Attorney, Agent, or Firm* — Bacon & Thomas, PLLC

(57) ABSTRACT

An electronic device storage case for use in storing a substrate therein, includes a hollow box-shaped case body. The case body includes an open surface with an opening, a bottom surface opposite to the opening and a sidewall extending upright from the peripheral edge of the bottom surface, wherein the sidewall of the case body including a plurality of deformable ribs each having a slant surface inclined inwards toward the bottom surface, and wherein the substrate is introduced into the case body through the opening and slidingly moves along the slant surface of each of the deformable ribs to make pressure contact with the slant surface.

10 Claims, 7 Drawing Sheets

(56) References Cited

U.S. PATENT DOCUMENTS

2008/0310006 A1* 12/2008 Kelley et al. .................. 359/267
2011/0026231 A1* 2/2011 Scordino .............. H05K 7/1417
                                                           361/759

FOREIGN PATENT DOCUMENTS

| JP | 2003-037913 | 2/2003 |
| JP | 2007-180278 A | 7/2007 |

* cited by examiner

ELECTRONIC DEVICE STORAGE CASE

FIELD OF THE INVENTION

The present invention relates to an electronic device storage case.

BACKGROUND OF THE INVENTION

Conventionally, a motor vehicle is equipped with, e.g., an ECU (Engine Control Unit) in which a substrate is stored within an electronic device storage case. The electronic device storage case includes two members locked together by a male-female locking unit.

The male-female locking unit of the electronic device storage case includes a locking projection portion protruding from one of the members and a locking hole portion formed on the surface of the other member facing the surface of one member on which the locking projection portion exists. The locking projection portion is inserted into and locked with the locking hole portion.

In the electronic device storage case provided with the male-female locking unit, it is likely that a gap is left between the locking projection portion and the locking hole portion due to manufacturing errors or other causes. If the electronic device storage case having a gap between the locking projection portion and the locking hole portion is used in an ECU of a motor vehicle, the locking projection portion and the locking hole portion make repeated contact with each other due to the vibrations generated in the running motor vehicle. This poses a problem of abnormal noises such as buzz, squeak and rattle.

As a solution to this problem, there is known an electronic device storage case in which an elastic portion is provided in one of case members to elastically bias the case members away from each other when the case members are locked together by a locking projection portion and a locking hole portion (see, e.g., Japanese Application Publication No. 2003-37913).

The electronic device storage case provided with the elastic portion is configured such that, when the locking projection portion and the locking hole portion are brought into engagement with each other, the elastic portion provided in one of the case members presses the other case member away from one case member. In this manner, the locking projection portion and the locking hole portion are press-contacted against with each other through the elastic portion so that no gap can be generated between the locking projection portion and the locking hole portion. This helps suppress loose engagement of the locking projection portion and the locking hole portion, which assists in preventing generation of abnormal noises.

In the electronic device storage case disclosed in Japanese Application Publication No. 2003-37913, however, no consideration is given to those noises generated by a substrate within the storage case during occurrence of vibrations. In other words, the substrate may rattle within the storage case during occurrence of vibrations and may contact with the inner surface of the storage case, consequently generating abnormal noises.

SUMMARY OF THE INVENTION

In view of the above, the present invention provides an electronic device storage case capable of preventing generation of abnormal noises caused by a substrate.

In accordance with one aspect of the present invention, there is provided an electronic device storage case for use in storing a substrate therein. The case body includes a hollow box-shaped case body including an open surface with an opening, a bottom surface opposite to the opening and a sidewall extending upright from the peripheral edge of the bottom surface, wherein the sidewall of the case body including a plurality of deformable ribs each having a slant surface inclined inwards toward the bottom surface, and wherein the substrate is introduced into the case body through the opening and slidingly moves along the slant surface of each of the deformable ribs to make pressure contact with the slant surface.

With the present invention, it is possible to provide an electronic device storage case capable of preventing generation of abnormal noises caused by a substrate.

BRIEF DESCRIPTION OF THE DRAWINGS

The objects and features of the present invention will become apparent from the following description of embodiments, given in conjunction with the accompanying drawings, in which.

DETAILED DESCRIPTION OF THE PREFERRED EMBODIMENTS

Hereinafter, one embodiment of the present invention will be described with reference to the accompanying drawings which form a part hereof.

An electronic device storage case in accordance with one embodiment of the present invention will now be described with reference to FIGS. 1 through 9.

Figure 1:
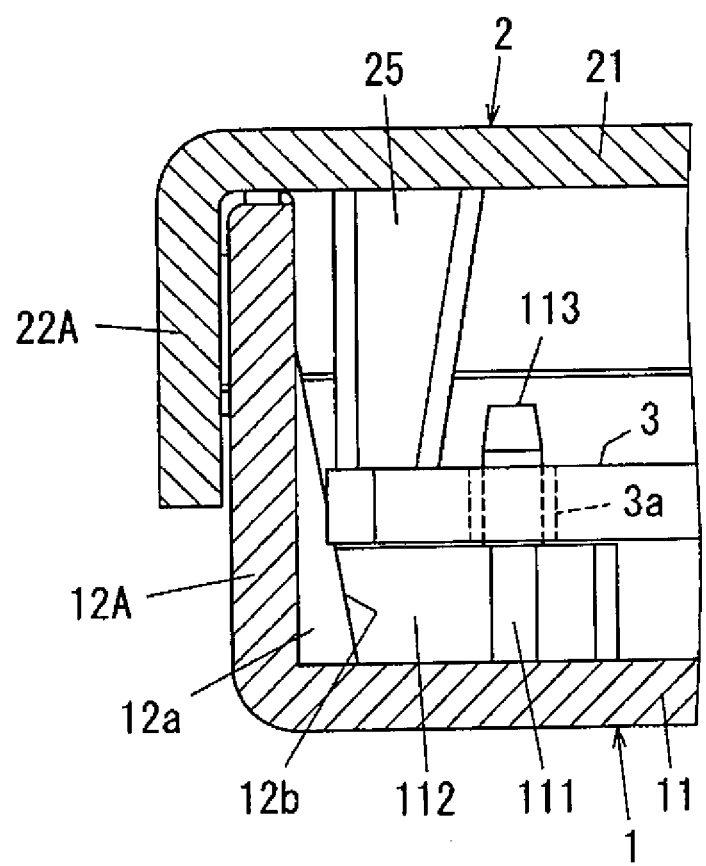
FIG. 1 is a section view showing certain major parts of an electronic device storage case in accordance with one embodiment of the present invention.
Figure 2:
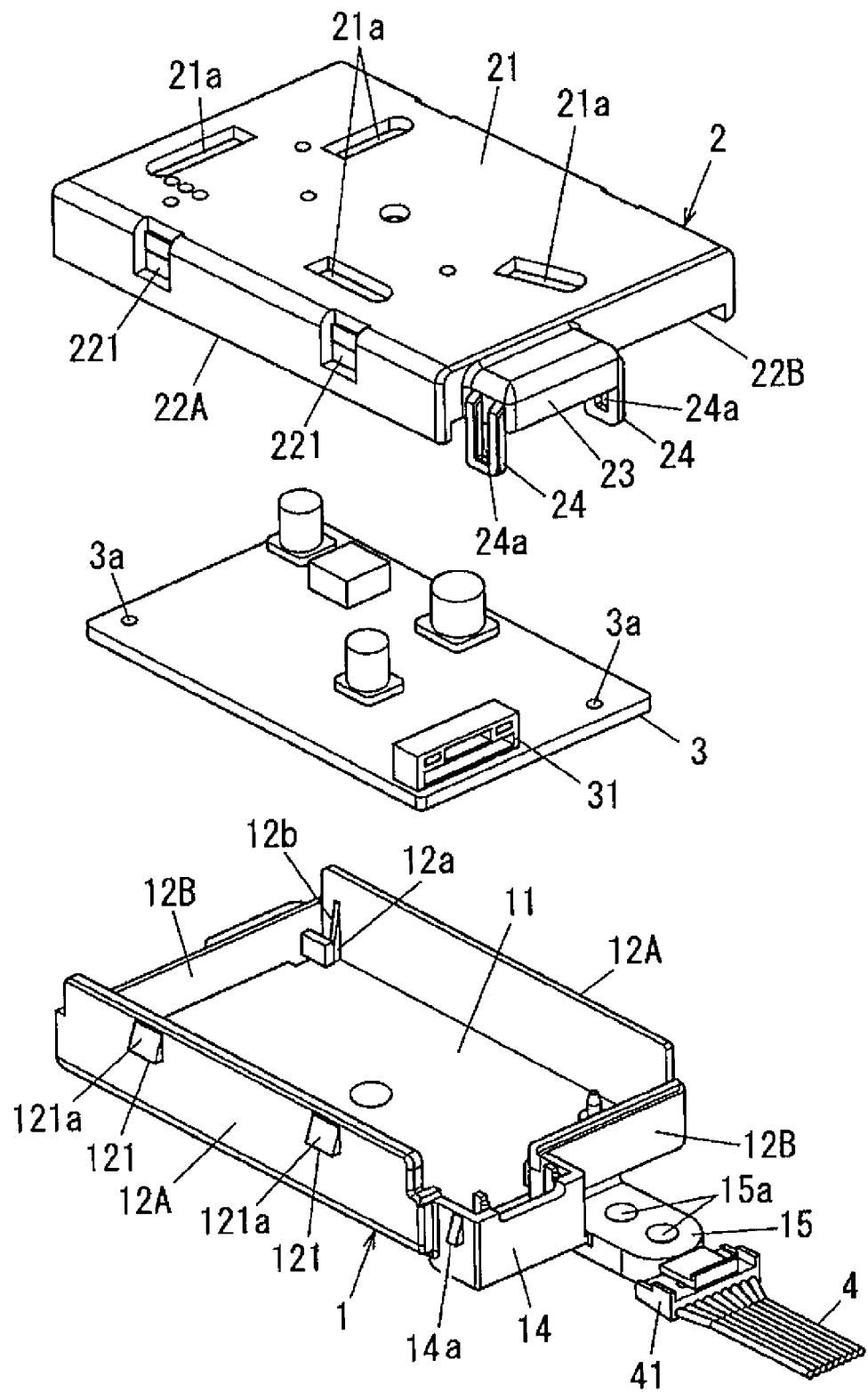
FIG. 2 is an exploded perspective view of the electronic device storage case.
Figure 3:
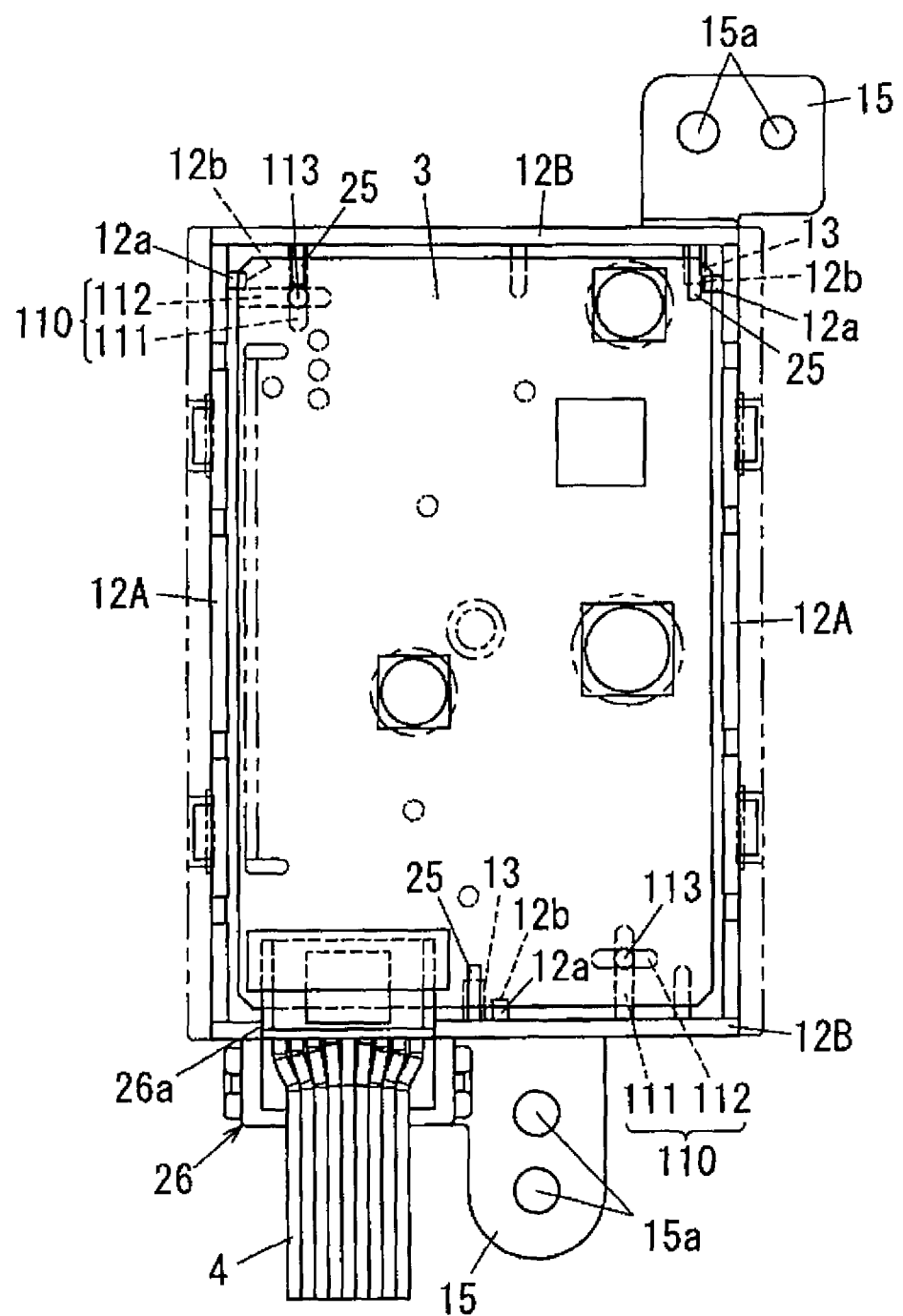
FIG. 3 is a section view of the electronic device storage case.

Referring to FIGS. 1 through 3, the electronic device storage case of the present embodiment is used in, e.g., an ECU of a motor vehicle to store a substrate 3 therein. The electronic device storage case includes a generally rectangular box-shaped case body 1 with one surface thereof opened and a case cover 2 attached to the case body 1 to close the opening of the case body 1.

As shown in FIG. 2, the case body 1 includes a generally rectangular base portion 11 and body wall portions 12 extending from the peripheral edge of the base portion 11 in a substantially perpendicular relationship with the base portion 11. In the description made herein below, the body wall portions 12 extending from the long sides of the base portion 11 will be referred to as "body wall portions 12A" and the body wall portions 12 extending from the short sides of the base portion 11 will be referred to as "body wall portions 12B". If there is no need to distinguish the body wall portions 12A and 12B from each other, they will be collectively called "body wall portions 12".

A plurality of (two, in the present embodiment) locking projection portions 121 is arranged side by side along a longitudinal direction on the outer surface of each of the body wall portions 12A near the opening of the case body 1.

Figure 4:
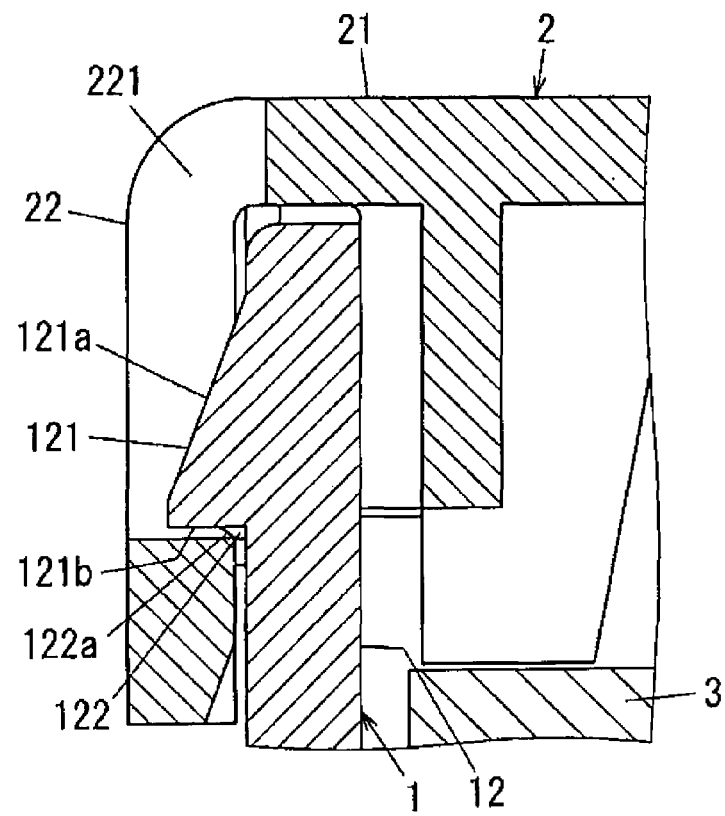
FIG. 4 is a section view of certain major parts of the electronic device storage case.
Figure 5:
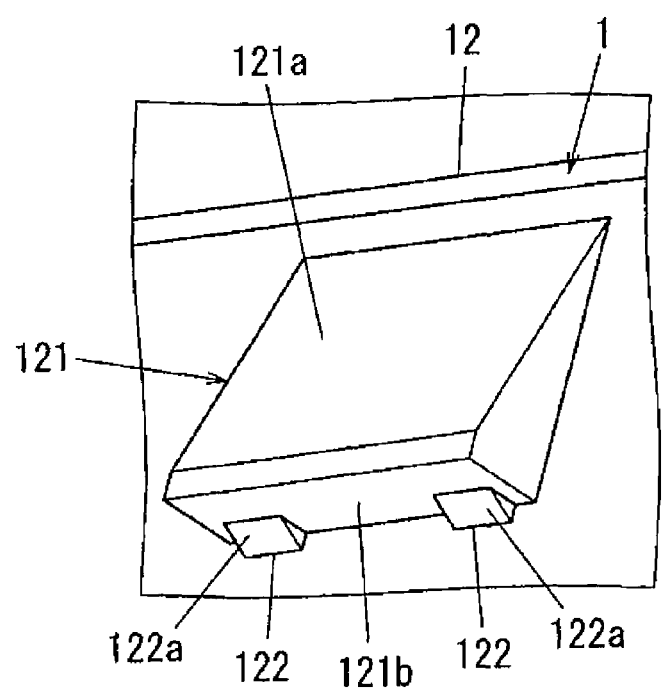
FIG. 5 is an enlarged view showing a locking projection portion of the electronic device storage case.

As can be seen in FIGS. 4 and 5, each of the locking projection portions 121 includes a slant surface 121a inclined outwards as it extends from the opening of the case body 1 toward the base portion 11 and a locking surface 121b formed substantially parallel to the base portion 11 so as to interconnect the tip end of the slant surface 121a and the corresponding body wall portion 12A, so that it has a substantially triangular cross-sectional shape.

Two fitting jut portions 122 of generally triangular cross-sectional shape are formed side by side on the locking surface 121b. Each of the jut portions 122 includes a slant surface 122a inclined toward the base portion 11 as it extends to the corresponding body wall portion 12.

Figure 6:
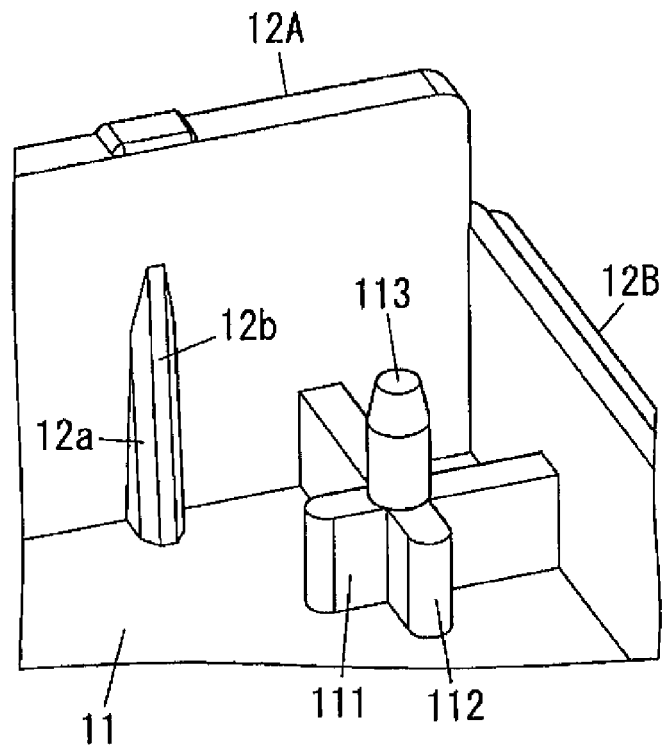
FIG. 6 is a perspective view of certain major parts of the electronic device storage case.

Around diagonally opposed two corners of the case body 1, cross ribs 110 of generally crisscross shape are arranged to protrude from the base portion 11 as shown in FIGS. 3 and 6. Each of the cross ribs 110 includes a support rib 111 substantially parallel to the long sides of the base portion 11 and a support rib 112 substantially parallel to the short sides of the base portion 11. A projection 113 protrudes from the intersection point of each of the cross ribs 110 toward the opening of the case body 1.

The projection 113 has a generally cylindrical columnar shape. The end extension of the projection 113 is formed into a generally truncated cone shape such that the diameter thereof grows smaller toward the tip end thereof.

Slant ribs (deformable ribs) 12a of generally triangular section shape are arranged on the body wall portions 12A near two opposite corner portions of one longitudinal end of the case body 1 to protrude from the body wall portions 12A, respectively. Each of the slant ribs 12a has a slant portion 12b inclined inwards as it extends from a position on the opening side of the case body 1 to the base portion 11. In addition, a slant rib 12a inclined inwards as it extends from a position on the opening side of the case body 1 to the base portion 11 protrudes from substantially the center of the body wall portion 12B arranged at the other longitudinal end of the case body 1.

In one corner portion of one longitudinal end of the case body 1 (where the cross ribs 110 do not exist) and substantially at the center of the other longitudinal end of the case body 1, support ribs 13 of generally rectangular solid shape are arranged to protrude from the base portion 11 toward the opening of the case body 1. In this regard, the tip ends of the support ribs 13 are flush with the tip ends of the support ribs 111 and 112.

The substrate 3 is put into the case body 1 from the opening of the case body 1 and is placed onto the cross ribs 110 and the support ribs 13, at which time the projections 113 are inserted into insertion holes 3a formed in diagonally opposed two corners of the substrate 3, thereby determining the position of the substrate 3 with respect to the case body 1. Since the end extension of each of the projections 113 have a generally truncated cone-like tapering shape, the projections 113 can be easily inserted into the insertion holes 3a of the substrate 3.

When the substrate 3 is placed onto the cross ribs 110 with the projections 113 inserted into the insertion holes 3a, the end portions of the substrate 3 are slidingly moved along the slant portions 12b of the slant ribs 12a and are pressed against the slant ribs 12a. In this process, the substrate 3 is fitted to the cross ribs 110 while crushing the slant ribs 12a. Thus, the substrate 3 is gripped by a plurality of (three, in the present embodiment) deformed slant ribs 12a within the case body 1 against movement in the transverse direction (in the direction orthogonal to the thickness direction of the substrate 3).

A fixing piece 15 having screw-fixing holes 15a is formed on the outer surface of the base portion 11 to extend outwards beyond one of the body wall portions 12B. The case body 1 is fixed to a holder member (not shown) by inserting screws (not shown) through the screw-fixing holes 15a of the fixing piece 15 and then threadedly tightening the screws into screw holes formed in the holder member.

The case cover 2 has a rectangular box shape with one surface thereof opened. The case cover 2 includes a generally rectangular top panel portion 21 and cover wall portions 22 extending from the peripheral edge of the top panel portion 21 in a perpendicular relationship with the top panel portion 21. In the description made herein below, the cover wall portions 22 extending from the long sides of the top panel portion 21 will be referred to as "cover wall portions 22A" and the cover wall portions 22 extending from the short sides of the top panel portion 21 will be referred to as "cover wall portions 22B". If there is no need to distinguish the cover wall portions 22A and 22B from each other, they will be collectively called "cover wall portions 22".

A connector insertion block 23 and a connector insertion block 14 protrude outwards from one of the cover wall portions 22B and one of the body wall portions 12B, respectively. When the case cover 2 is fixed to the case body 1, engaging protrusion portions 14a formed on the outer surface of the connector insertion block 14 come into engagement with engaging holes 24a of coupling portions 24 formed on the outer surface of the connector insertion block 23, thereby forming a hollow box-shaped connector insertion portion 26.

A generally-rectangular connector insertion hole 26a is defined at the tip end of the connector insertion portion 26. A connector 41 having signal lines 4 is introduced into the electronic device storage case through the connector insertion hole 26a. Then, the connector 41 is connected to a connector 31 provided in the substrate 3, whereby sensors or other components (not shown) are electrically connected to the substrate 3.

The case cover 2 is attached to the case body 1 with the openings of the case cover 2 and the case body 1 opposed to each other. At this time, the outer surfaces of the body wall portions 12A and the inner surfaces of the cover wall portions 22A face toward each other. Locking hole portions 221 of generally rectangular shape are formed in the cover wall portions 22A in alignment with the locking projection portions 121 provided on the outer surface of the body wall portions 12A. The locking projection portions 121 are inserted into and engaged with the locking hole portions 221.

When fixing the case body 1 and the case cover 2 together, they are first caused to move toward each other with the opening of the case body 1 opposed to the opening of the case cover 2. Thus, the slant surfaces 121a of the locking projection portions 121 make contact with the tip ends of the cover wall portions 22A. If the case body 1 and the case cover 2 are further moved toward each other, the inner surfaces of the cover wall portions 22A are pressed by the slant surfaces 121a and are bent outwards along the slant surfaces 121a. Subsequently, the locking projection portions 121 are fitted into the locking hole portions 221 of the cover wall portions 22A. The locking projection portions 121 and the locking hole portions 221 are locked together, as a result of which the case cover 2 is attached to the case body 1.

When the locking projection portions 121 and the locking hole portions 221 are locked together, the locking projection portions 121 are fitted into the locking hole portions 221. The inner surfaces of the locking hole portions 221 are slidingly moved on the slant surfaces 122a of the fitting jut portions 122, thereby pressing and crushing the fitting jut portions 122. Since the fitting jut portions 122 are formed into a generally triangular cross-sectional shape so that they can be inclined toward the base portion 11 as they extend from the tip ends of the locking projection portions 121 to the body wall portions 12, the locking action occurs smoothly. As a result, the fitting jut portions 122 integrally formed with the locking projection portions 121 can be crushed within the locking hole portions 221 to fill the gaps existing between the locking projection portions 121 and the locking hole portions 221. Since the gaps existing between the locking projection portions 121 and the locking hole portions 221 are filled with the fitting jut portions 122, it is possible to restrain the locking parts from rattling during occurrence of vibrations and to prevent generation of abnormal noises through the use of a simple structure, even if manufacturing errors exist in the locking projection portions 121 and the locking hole portions 221.

Figure 7:
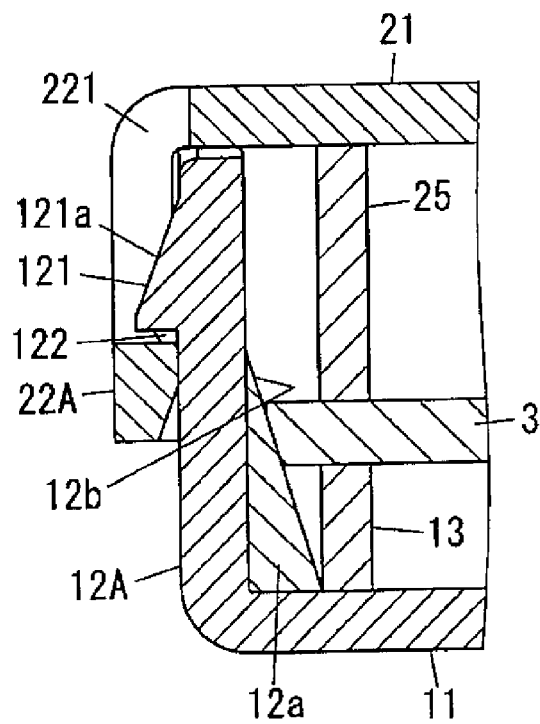
FIG. 7 is a section view of certain major parts of the electronic device storage case.

As shown in FIGS. 1 and 7, push ribs 25 of generally trapezoidal plate shape having a cross-sectional area gradually decreased from the top panel portion 21 toward the opening of the case cover 2 are formed in the case cover 2 to protrude from the top panel portion 21. The tip ends of the push ribs 25 make contact with one surface of the substrate 3 (the upper surface of the substrate 3 in FIG. 7). The tip ends of the push ribs 25 are opposed through the substrate 3 to the tip ends of the support ribs 13 and the tip ends of the support ribs 111 provided at one longitudinal end of the case body 1, which remain in contact with the other surface of the substrate 3. In other words, the substrate 3 is gripped by the push ribs 25, the support ribs 13 and the support ribs 111 and is restrained from rattling in the thickness direction.

Figure 8:
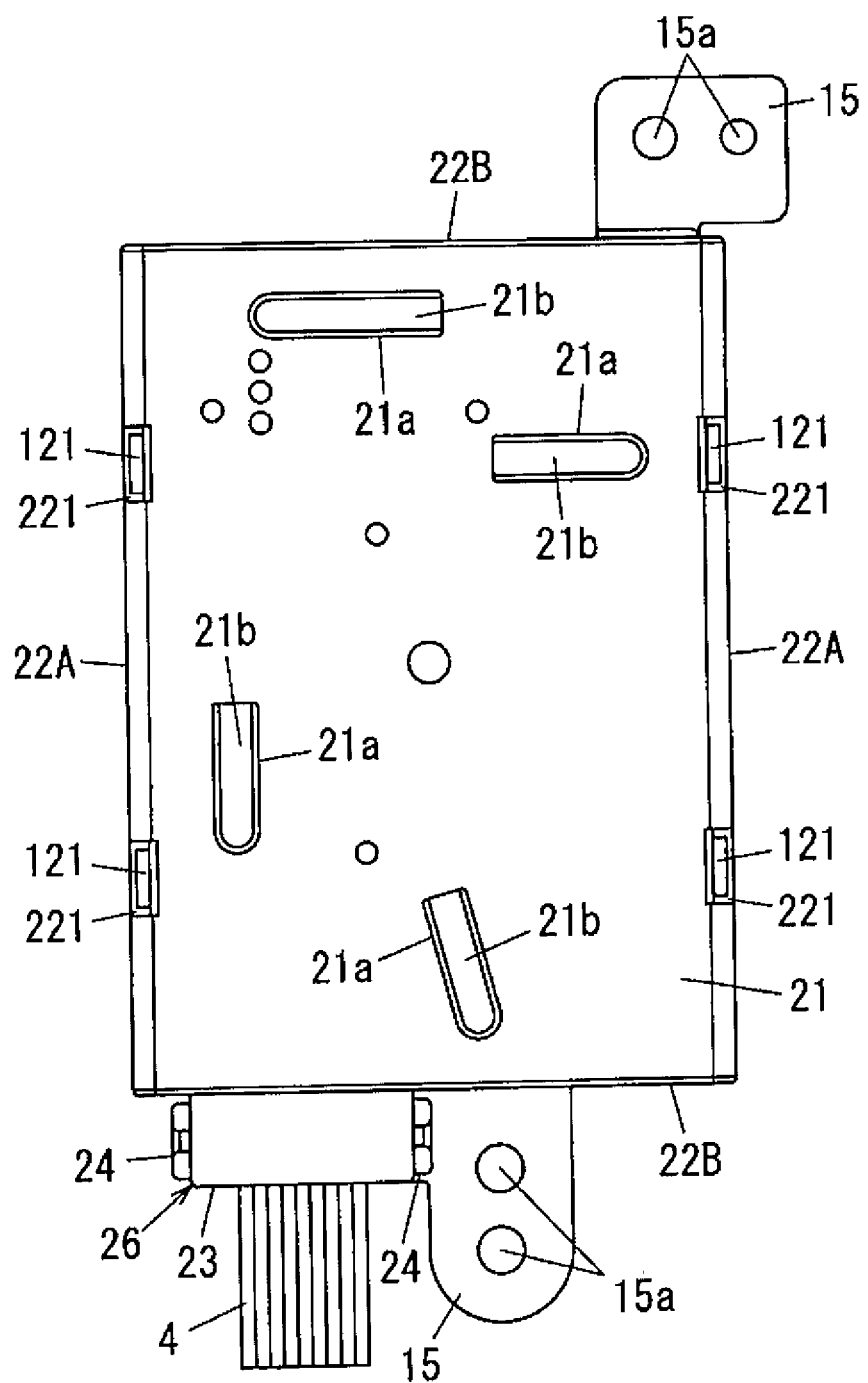
FIG. 8 is a plan view of the electronic device storage case.
Figure 9:
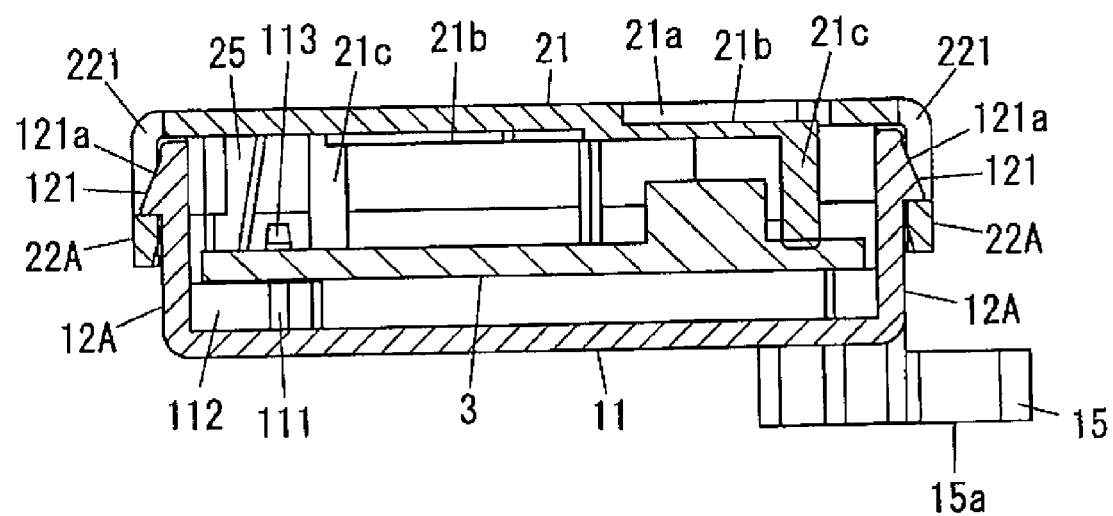
FIG. 9 is a section view of the electronic device storage case.

As shown in FIGS. 8 and 9, a plurality of generally U-shaped cutouts 21a is formed in the top panel portion 21. Leaf spring portions 21b having elasticity acting in the thickness direction are formed in the areas of the top panel portion 21 surrounded by the respective cutouts 21a. Push portions 21c of generally cylindrical columnar shape are attached to the tip ends of the leaf spring portions 21b in such a manner as to protrude toward the opening of the case cover 2. The push portions 21c make contact with one surface of the substrate 3 at the tip ends thereof. Since the leaf spring portions 21b have elasticity acting in the downward direction (in the direction in which the push portions 21c are biased toward the substrate 3), the push portions 21c can push one surface of the substrate 3. Thus, the push portions 21c is able to further restrain the substrate 3 from rattling in the thickness direction.

With the electronic device storage case of the present embodiment, the substrate 3 is gripped by a plurality of slant ribs 12a within the storage case and is retrained from rattling. This makes it possible to prevent generation of abnormal noises caused by the substrate 3.

The support ribs 13, the cross ribs 110, the push ribs 25 and the push portions 21c further restrains the substrate 3 from rattling in the thickness direction. This makes it possible to reliably suppress the rattling of the substrate and to prevent generation of abnormal noises even when there are generated vibrations.

With the electronic device storage case of the present embodiment, it is therefore possible to prevent generation of rattling sounds both in the locking parts of the locking projection portions 121 and the locking hole portions 221 and in the substrate 3 stored within the electronic device storage case.

While the fitting jut portions 122 are made of a resin in the present embodiment, they may be formed from an elastic material. In this case, if the locking projection portions 121 and the locking hole portions 221 are disengaged from each other, the fitting jut portions 122 are elastically restored to the original state.

Therefore, even when the case cover 2 is re-attached to the case body 1, the locking projection portions 121 and the locking hole portions 221 are kept free from rattling. This makes it possible to prevent generation of abnormal noises.

In the present embodiment, the locking projection portions 121 are formed in the case body 1 and the locking hole portions 221 are formed in the case cover 2. Alternatively, the locking hole portions 221 may be formed in the case body 1 and the locking projection portions 121 may be formed in the case cover 2.

While the invention has been shown and described with respect to the embodiments, it will be understood by those skilled in the art that various changes and modification may be made without departing from the scope of the invention as defined in the following claims.

What is claimed is:

1. An electronic device storage case for use in storing a substrate therein, comprising:
   a hollow box-shaped case body including an open surface with an opening, a bottom surface positioned opposite to the opening and a sidewall extending from a peripheral edge of the bottom surface, and
   a hollow box-shaped case cover detachably attached to the case body, the case cover including a panel portion, a sidewall extending from a peripheral edge of the panel portion, and a push rib protruded from the panel portion,
   wherein the case body further includes;
   a locking projection portion protruded from an outer surface of the sidewall of the case body, the locking projection portion including a slant surface inclined outwards and a locking surface formed between an outer end of the slant surface and the sidewall of the case body, and
   a fitting jut portion formed on the locking surface and inclined outwards and having a slant surface extending from the outer surface of the sidewall to the locking surface,
   wherein the case cover includes a locking hole portion formed through the sidewall of the case cover, the locking projection portion being inserted into and engaged with the locking hole portion when the case cover is attached to the case body, and
   wherein an inner surface of the locking hole portion is configured to slidingly move on the slant surface of the fitting jut portion when attaching the case cover to the case body and the slant surface of the fitting jut portion is configured to be pressed and crushed by an inner surface of the locking hole portion in a state where the case cover is attached to the case body, whereby a gap between the locking projection portion and the locking hole portion is filled with the fitting jut portion,
   wherein the slant surface of the fitting jut portion is continuously slanted from the outer surface of the sidewall to the locking surface, and
   wherein the fitting jut portion has a generally triangular cross-sectional shape.

2. The case of claim 1, wherein the case body further includes a support rib protruded from the bottom surface to support the substrate.

3. The case of claim 2, wherein the push rib is configured to be positioned opposite to the support rib when the case cover is attached to the case body.

4. The case of claim 1, wherein the push rib is configured to make contact with the substrate when the case cover is attached to the case body.

5. The case of claim 2, wherein the push rib is configured to make contact with the substrate when the case cover is attached to the case body.

6. The case of claim 1, wherein the sidewall of the case body includes a plurality of deformable ribs each having a slant surface inclined inwards toward the bottom surface, and wherein the substrate is introduced into the case body through the opening and slidingly moves along the slant surface of each of the deformable ribs to make pressure contact with the slant surface.

7. The case of claim 2, wherein the sidewall of the case body includes a plurality of deformable ribs each having a slant surface inclined inwards toward the bottom surface, and wherein the substrate is introduced into the case body through the opening and slidingly moves along the slant surface of each of the deformable ribs to make pressure contact with the slant surface.

8. The case of claim 3, wherein the sidewall of the case body includes a plurality of deformable ribs each having a slant surface inclined inwards toward the bottom surface, and wherein the substrate is introduced into the case body through the opening and slidingly moves along the slant surface of each of the deformable ribs to make pressure contact with the slant surface.

9. The case of claim 4, wherein the sidewall of the case body includes a plurality of deformable ribs each having a slant surface inclined inwards toward the bottom surface, and wherein the substrate is introduced into the case body through the opening and slidingly moves along the slant surface of each of the deformable ribs to make pressure contact with the slant surface.

10. The case of claim 1, wherein the locking projection portion has a substantially triangular cross-sectional shape.

* * * * *